(12) United States Patent
Englekirk

(10) Patent No.: US 10,476,515 B2
(45) Date of Patent: *Nov. 12, 2019

(54) NON-LINEAR CONVERTER TO LINEARIZE THE NON-LINEAR OUTPUT OF MEASUREMENT DEVICES

(71) Applicant: pSemi Corporation, San Diego, CA (US)

(72) Inventor: Robert Mark Englekirk, Littleton, CO (US)

(73) Assignee: pSemi Corporation, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/167,374

(22) Filed: Oct. 22, 2018

(65) Prior Publication Data

US 2019/0058485 A1    Feb. 21, 2019

Related U.S. Application Data

(63) Continuation of application No. 14/997,276, filed on Jan. 15, 2016, now Pat. No. 10,128,864.

(51) Int. Cl.
*H03M 1/46* (2006.01)
*G01K 15/00* (2006.01)
(Continued)

(52) U.S. Cl.
CPC .............. *H03M 1/464* (2013.01); *G01K 7/01* (2013.01); *G01K 7/25* (2013.01); *G01K 15/005* (2013.01); *G01K 2219/00* (2013.01)

(58) Field of Classification Search
CPC ........... H03M 1/464; G01K 7/25; G01K 7/01; G01K 15/005
(Continued)

(56) References Cited

U.S. PATENT DOCUMENTS 4,975,700 A * 12/1990 Tan ..................... H03M 1/0612
341/118
5,119,095 A * 6/1992 Asazawa ............... H03M 1/785
341/118

(Continued)

OTHER PUBLICATIONS

Mai, Lam T., Office Action received from the USPTO dated Dec. 14, 2017 for U.S. Appl. No. 14/997,276, 5 pgs.

(Continued)

*Primary Examiner* — Lam T Mai
(74) *Attorney, Agent, or Firm* — Jaquez Land Greenhaus LLP; Alessandro Steinfl

(57) ABSTRACT

A non-linear converter comprising a non-linear voltage divider having a plurality of resistors representing a non-linear transfer function, an analog multiplexer having analog multiplexer inputs coupled to the non-linear voltage divider and configured to output an analog multiplexer output, the analog multiplexer chooses one of the plurality of resistors based on a logic signal and the non-linear transfer function, an analog comparator having an analog comparator first input configured to receive an analog input voltage, an analog comparator second input configured to receive the analog multiplexer output and the analog comparator configured to output a comparator voltage output and a logic loop coupled to the analog comparator and configured to receive the comparator voltage output and configured to output the logic signal, wherein the logic signal represents a linearized digital word.

20 Claims, 11 Drawing Sheets

(51) Int. Cl.
*G01K 7/01* (2006.01)
*G01K 7/25* (2006.01)

(58) Field of Classification Search
USPC .................................................. 341/118–155
See application file for complete search history.

(56) References Cited

U.S. PATENT DOCUMENTS

| | | | | |
|---|---|---|---|---|
| 5,757,298 | A * | 5/1998 | Manley | G09G 5/02 341/118 |
| 6,072,369 | A | 6/2000 | Dhong et al. | |
| 6,154,121 | A * | 11/2000 | Cairns | H03M 1/664 341/118 |
| 6,337,646 | B1 * | 1/2002 | Hatani | H03M 1/0612 341/118 |
| 6,977,603 | B1 * | 12/2005 | Barna | H03M 1/367 341/118 |
| 7,612,702 | B2 * | 11/2009 | Danesh | H03M 1/464 341/155 |
| 7,800,521 | B2 * | 9/2010 | Madisetti | H03M 1/1038 341/118 |
| 8,018,363 | B2 * | 9/2011 | Brooks | H03M 7/3013 341/118 |
| 8,577,023 | B2 | 11/2013 | Shirai et al. | |
| 10,128,864 | B2 * | 11/2018 | Englekirk | G01K 7/01 |
| 2005/0219088 | A1 * | 10/2005 | Batruni | H03M 1/0612 341/118 |
| 2011/0227769 | A1 * | 9/2011 | Lin | H03M 1/109 341/120 |
| 2016/0254820 | A1 * | 9/2016 | Ward | H03M 1/0604 341/118 |

OTHER PUBLICATIONS

Mai, Lam T., Office Action received from the USPTO dated Mar. 12, 2018 for U.S. Appl. No. 14/997,276, 6 pgs.

Mai, Lam T., Notice of Allowance received from the USPTO dated Jul. 13, 2018 for U.S. Appl. No. 14/997,276, 9 pgs.

PSemi Corporation; Response filed in the USPTO dated May 30, 2018 for U.S. Appl. No. 14/997,276, 10 pgs.

PSemi Corporation; Response filed in the USPTO dated Jan. 10, 2018 for U.S. Appl. No. 14/997,276, 3 pgs.

* cited by examiner

NON-LINEAR CONVERTER TO LINEARIZE THE NON-LINEAR OUTPUT OF MEASUREMENT DEVICES

BACKGROUND

This application is a continuation of, and claims the benefit of priority under 35 USC § 120 of, commonly assigned and co-pending prior U.S. application Ser. No. 14/997,276, filed Jan. 15, 2016, "Non-Linear Converter to Linearize the Non-Linear Output of Measurement Devices", the disclosure of which is incorporated herein by reference in its entirety.

BACKGROUND

(1) Technical Field

The present disclosure relates to converters and more specifically to non-linear converters for linearizing the output of non-linear measurement devices.

(2) Background

To measure temperature on an integrated circuit, diode voltages may be used as a temperature reference. Often, dissimilar current densities of two diodes or a single diode with a current proportional to temperature may be used. In either case, very accurate temperature measurement is difficult because the temperature behavior of a diode is not linear, some second order non-linearity exists. This issue uncovers a need that exists for the linearization of non-linear responses of measured quantities.

SUMMARY OF THE INVENTION

In one embodiment a non-linear converter comprising a non-linear voltage divider having a plurality of resistors representing a non-linear transfer function, an analog multiplexer having analog multiplexer inputs coupled to the non-linear voltage divider and configured to output an analog multiplexer output, the analog multiplexer chooses one of the plurality of resistors based on a logic signal and the non-linear transfer function, an analog comparator having an analog comparator first input configured to receive an analog input voltage, an analog comparator second input configured to receive the analog multiplexer output and the analog comparator configured to output a comparator voltage output and a logic loop coupled to the analog comparator and configured to receive the comparator voltage output and configured to output the logic signal, wherein the logic signal represents a linearized digital word.

In a further embodiment a method of linearizing non-linear voltage response outputs comprising, receiving a non-linear voltage response indicative of a measured quantity, converting the non-linear voltage response to a digital output and matching non-linear voltage response indicative of the measured quantity to a non-linear converter, wherein the non-linear voltage response of the measured quantity is a linearized digital word.

In yet another embodiment a method of extending a number of bits of a digital to analog converter (DAC) comprising receiving a first signal to open or short a series of top resistors at a high voltage, receiving a second signal which is complementary to said first signal to open or short a series of bottom resistors at a low voltage and extending the number of bits of a digital analog converter based on an output of the bottom resistors and the top resistors.

In yet a further embodiment a method of calibrating temperature outputs comprising measuring a precision voltage reference of a temperature sensor at room temperature, dividing the precision voltage reference with at least two digital potentiometers and adjusting calibration of a temperature output circuit based on the measured precision voltage reference utilizing the at least two digital potentiometers.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION OF THE INVENTION

Figure 1:
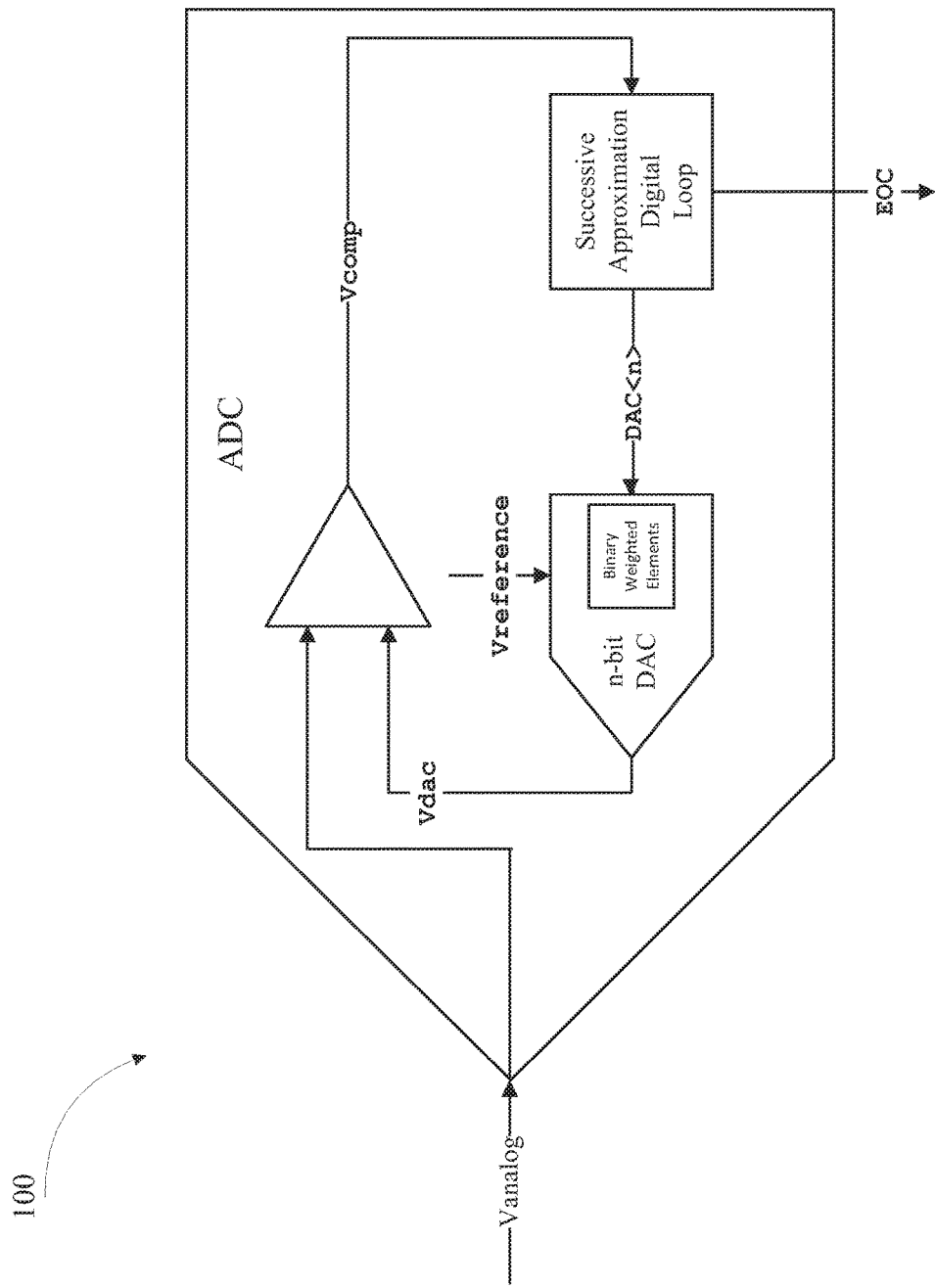
FIG. 1 is an overview of a prior art system.

FIG. 1 depicts a prior art example of a successive approximation (SAR) analog to digital converter (ADC). The successive approximation digital loop (SAR) is initialized so that the most significant bit (MSB) is equal to a digital 1. Digital signal DAC<n> is received by the n-bit DAC, which then generates an analog equivalent of this digital code, Vdac, Vreference/2 at this point. Vdac is received by a comparator circuit for comparison with Vanalog. If Vanalog exceeds Vdac, Vcomp is positive and the comparator causes the SAR to set this bit to 0. If Vanalog is less then Vdac, Vcomp is negative and the bit remains a 1. At this point, the next bit is set to 1 and the same test is performed, continuing the binary search until each bit in the SAR has been tested. The resulting digital word is the digital approximation of Vanalog and is output by the SAR, and is validated by end of the conversion (EOC) signal. Within the n-bit DAC, binary weighted elements are typically utilized to create Vdac. This configuration does not allow non-linear conversion of the DAC. In other words, it cannot be utilized effectively for non-linear conversion.

Most temperature sensors are low power and low speed and employ a successive approximation (SAR) analog to digital converter (ADC) having binary weighted elements as shown in FIG. 1, by virtue of the binary design, these are linear and do not match the inherently non-linear characteristics of a diode.

Figure 2:
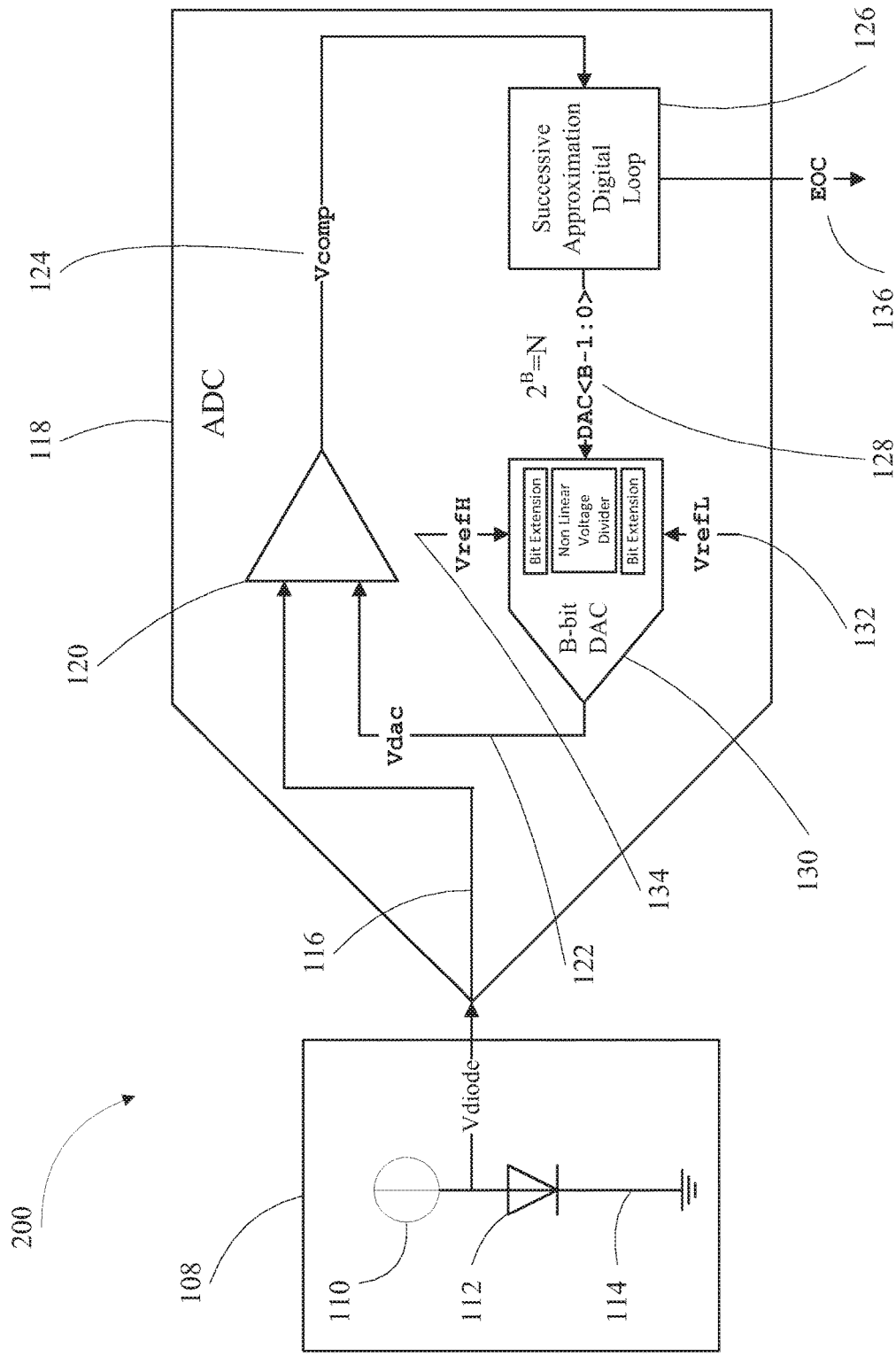
FIG. 2 is an overview of an example system in accordance with one embodiment of the disclosure.

FIG. 2 depicts an example 2-stage resistor string DAC. This DAC is then employed in a SAR ADC. The core of an example DAC is a 6-bit non-linear voltage divider with a 64:1 analog switch, although the number of bits of resolution may vary depending upon need and available space. The example DAC is designed to match the non-linearity of the diode characteristic over temperature. Thus lining up individual thresholds of the ADC with diode voltages at specific temperatures, and effectively removing a large portion of the diode temperature response non-linearity. Within the B-bit DAC 130 is a non-linear voltage divider. This voltage division is not restricted to resistors, but may employ capacitors, inductors or active elements such as diodes, transistors and the like. The non-linear voltage divider is dissipated between a high voltage reference VrefH and a low voltage reference VrefL. By adjusting VrefH and VrefL a centering of the DAC may be done. Additionally, the DAC has a set of bit extension resistors and switches which increases the number of bits of the DAC.

In one example, the second stage of the ADC is designed to add two bits of resolution to the 6-bit string by the addition of four resistors and four switching devices. By utilizing switches at the top and bottom of the ladder to add in 1-LSB (Least Significant Bit) and/or 2-LSB sized resistors, it is possible to have 3 LSB resistors split between the top and bottom of the ladder thus shifting the entire ladder by the number of bits, leaving the total resistance of the ladder unchanged. This technique may reduce the layout area of the DAC by a factor of 4, or yield 4× more resolution for a minimal increase in build area.

Calibration may be performed at the production room temperature. Seldom in low cost designs is it practical to test at multiple temperatures to reduce the error at the temperature extremes. Thus the error in the temperature sensor gets worse the farther you are from room temperature at which the calibration was performed.

By characterizing the sources causing error over temperature, it is possible to correlate measurements made at room temperature with the errors at temperature and do a first order correction. A precision bandgap voltage may be used to setup the range of the ADC performing the quantization. If the bandgap voltage is off by 1%, the gain of the temperature sensor may be off by a similar percentage. By measuring the bandgap voltage at room temperature during production, and adjusting the calibration accordingly through the use of digital potentiometers as a voltage divider to divide a precision voltage reference into VrefH and VrefL, gain error may be reduced.

FIG. 2 depicts an analog to digital converter 118 (ADC) comprising an analog comparator 120 having an analog comparator first input configured to receive a non-linear voltage output representative of a measurement outputted from measurement box 108. In this example the non-linear voltage output is supplied by a diode, supplying an analog input voltage 116 (Vdiode in this example) indicative of temperature, an analog comparator second input is configured to receive a digital to analog converter voltage 122 (Vdac) and the analog comparator is configured to output a comparator voltage output 124 (Vcomp). A SAR 126 is configured to receive the comparator voltage output 124 (Vcomp) and configured to output a logic signal 128 (DAC<B−1:0>) where $2^B$=N and an end of conversion (EOC) output when a binary search routine finds a DAC code and corresponding voltage that best matches the measured quantity. The SAR loop (logic loop) outputs an End of Conversion (EOC) signal when it is complete, and will output the linearized digital word as its final output. A non-linear digital to analog converter 130 (DAC) having a non-linear voltage divider comprised of N−1 resistors matching a non-linear diode voltage indicative of temperature. The non-linear analog to digital converter 130 may also comprise bit extensions which will be discussed in greater detail. The DAC is configured to correct for the non-linearity of the diode voltage across temperature. The SAR 126, once having completed quantizing the analog input voltage 116, has at its output effectively a digitally corrected representation of temperature end of conversion output 136 that is a linearized digital word of the measured quantity. The non-linear digital to analog converter 130 (DAC) is configured to receive a voltage reference high input 134 (VrefH) and a voltage reference low input 132 (VrefL) feeding the upper and lower branches of the non-linear voltage divider respectively.

In this example the non-linear measured quantity 108 comprises a current source 110 feeding a temperature sensing diode 112 that is coupled to ground 114. The analog input voltage 116 is coupled to one input of the analog comparator 120.

In this instance the non-linear measured quantity 108 may be similarly replaced with any form of non-linear sensor measurement such as temperature for example utilizing a silicon bandgap temperature sensor, a resistance thermometer, a thermocouple, a thermistor, or a thermopile and the like. The measured quantity may also be pressure, irradiance, power or the like. Sensors may comprise a piezoresistive sensor, a capacitive sensor, an inductive sensor, a Hall Effect sensor, an eddy current sensor, a piezoelectric sensor, an optical sensor, a potentiometric sensor, a photoconductive sensor, a photovoltaic sensor, a photodiode sensor, a phototransistor sensor, a CMOS image sensor, voltage sensor, current sensor, power sensor or the like.

The disclosure applies to linearizing a source that outputs a known non-linear response, thus creating a transfer function. One example of this would be linear to log mapping. The disclosure may also be applied to output a non-linear response from a linear input.

Figure 3:
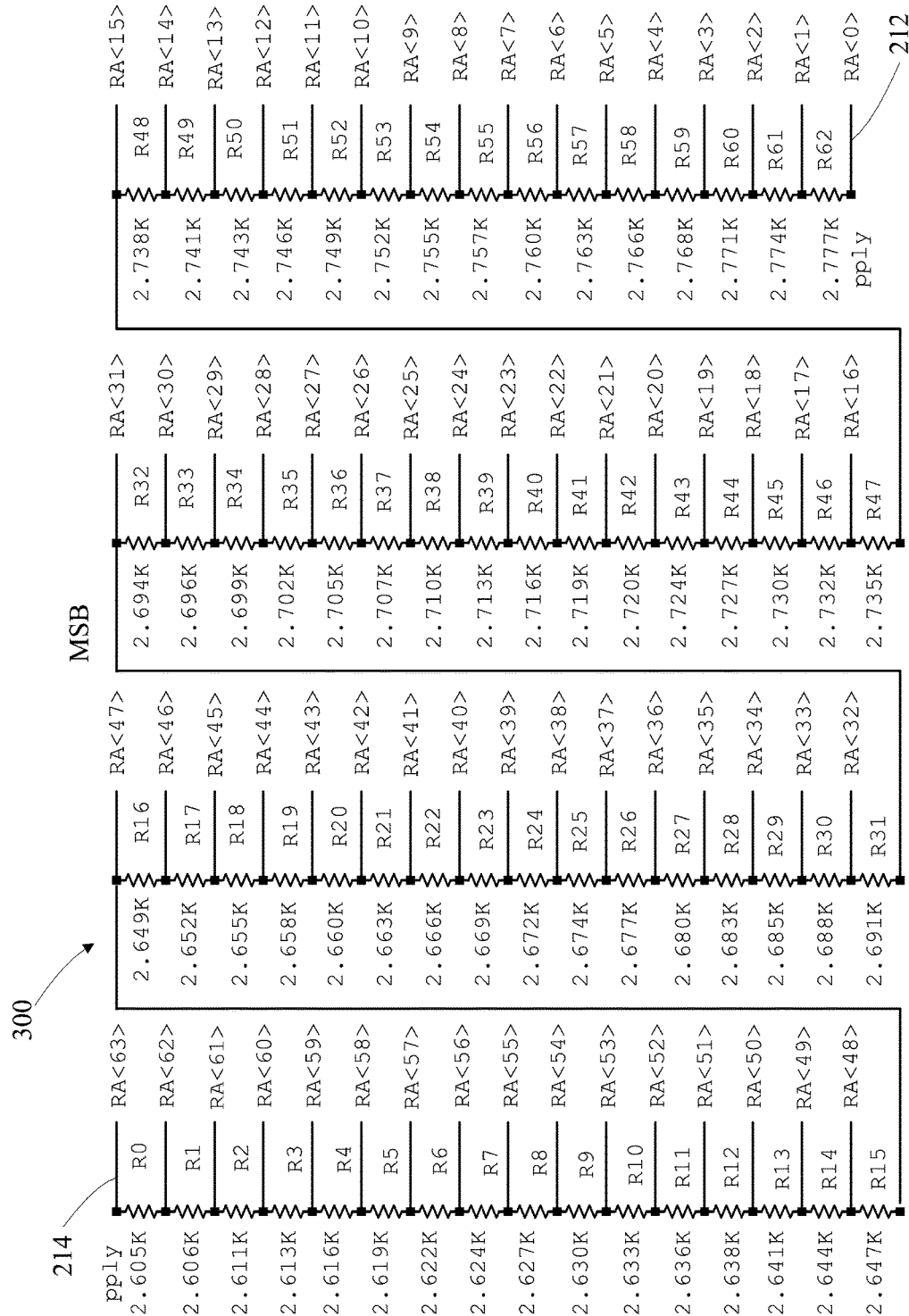
FIG. 3 is an example of a non-linear voltage divider in accordance with one embodiment of the disclosure.

The resistors in FIG. 3 create a non-linear voltage divider with 64 divider tap points from VrefH to VrefL. The choice of individual resistor values in this resistor chain lets the designer create an arbitrary mapping of voltage level to digital value. The example in FIG. 3 shows increasing resistance values from top to bottom. Thus the voltage from RA<0> to RA<1> is larger than RA<1> to RA<2> and so on. Effectively any transfer function can be created to map the analog voltage to the digital value. The resistors may be designed to have a specific resistance by area, size, laser trim or the like. The upper resistor in the network being R0, having a non-linear voltage divider output (RA<63>) 214 and the lower resistor in the network being R62, having a non-linear voltage divider output (RA<0>) 212. Although a specific number of resistors are shown in this example, any number of resistors may be used to meet the designed resolution of the system. In this example the resistors are comprised of p-doped poly, but may be comprised of metal, or the like and may be doped with another type of dopant to cause the resistors to have the designed resistivity.

Figure 4:
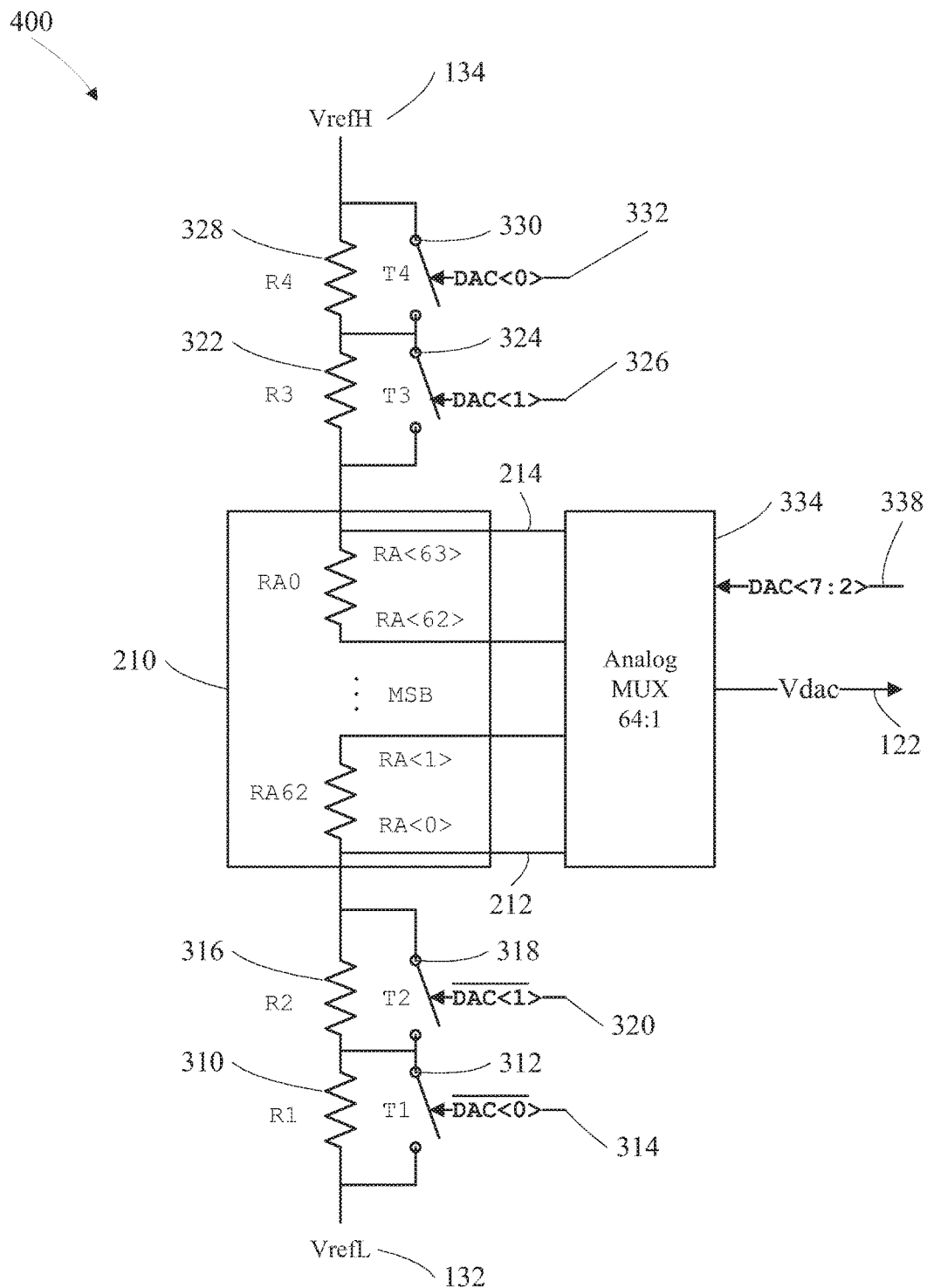
FIG. 4 is an example of a DAC using a linear or non-linear voltage divider, extended bits and an analog multiplexer in accordance with one embodiment of the disclosure.

FIG. 4 depicts an example non-linear voltage divider with extended bits comprising a first lower bit extension resistor 316 (R2) coupled to a lower end of said non-linear voltage divider output (RA<0>) 212, a first lower bit extension switch 318 (T2) coupled in parallel with the first lower bit extension resistor 316 (R2), wherein the first lower bit extension switch is modulated by a first complementary DAC extension bit input 320 (DAC<1>bar). The use of the term complementary indicates a signal level opposite the non-complementary signal, for example if the signal is "0", the complement would be "1".

A second lower bit extension resistor 310 (R1) is coupled to the first lower bit extension resistor 316 (R2) opposite the end coupled to the lower end of said non-linear voltage divider and a second lower bit extension switch 312 (T1) coupled in parallel with the second lower bit extension resistor 310 (R1), wherein the second lower bit extension switch is modulated by a second complementary DAC extension bit input 314 (DAC<0>bar).

A first upper bit extension resistor 322 (R3) coupled to an upper end of said non-linear voltage divider (RA<63>), a first upper bit extension switch 324 (T3) is coupled in parallel with the first upper bit extension resistor 322 (R3), wherein the first upper bit extension switch 324 (T3) is modulated by a first DAC extension bit input 326 (DAC<1>).

A second upper bit extension resistor 328 (R4) is coupled to the first upper bit extension resistor 322 (R3) opposite the end coupled to the upper end of said non-linear voltage divider and a second upper bit extension switch 330 (T4) coupled in parallel with the second upper bit extension resistor 328 (R4), wherein the second upper bit extension switch 330 (T4) is modulated by a second DAC extension bit input 332 (DAC<0>). The number of extension bits on top and bottom is arbitrary depending on required accuracy, space limitations, and resolution. The LSB (DAC<0>) drives the switches with value R (R1, R4) and $2^{nd}$ LSB (DAC<1>) drives the switches with value 2R (R2, R3). The non-linear voltage divider 210 comprises resistors of value nominally around a value of 4R. If they are not the same value, a non-linear output is expected. The generic resistor value R is arbitrary and depends on available power, resolution and available area.

The Least Significant Bit (LSB) denotes the smaller resistor and it is connected in parallel to its associated switch, either the first or second resistor and associated switch may be the LSB. There is no specific order of the resistors in the stack of the disclosure, as the LSB may be the first resistor and switch or second resistor and switch. There is one LSB resistor and one $2^{nd}$ LSB resistor which may assume any position on either the top or the bottom. The DAC<0> convention refers to LSB and the LSB switch is the one with the LSB resistor (R). The DAC<1> convention refers to the $2^{nd}$ LSB. In FIG. 3, one of the two resistors is the LSB (R), and the other is the second LSB or 2R. In another embodiment we may have 3 (R) resistor/switches make up the LSB and 2nd LSB. The final resistor value of [0, R, 2R, 3R] at the top and the opposite at the bottom [3R, 2R, R, 0] results in Rtop+Rbottom=3R. This may be accomplished with two resistor/switches [R, 2R] or 3 resistor/switches [R, R, R].

An analog multiplexer 334 having analog multiplexer inputs coupled to the non-linear voltage divider 210 and configured to output an analog multiplexer output 122 (Vdac). The $3^{rd}$ LSB of the DAC input drives the LSB of the AMUX.

Figure 5:
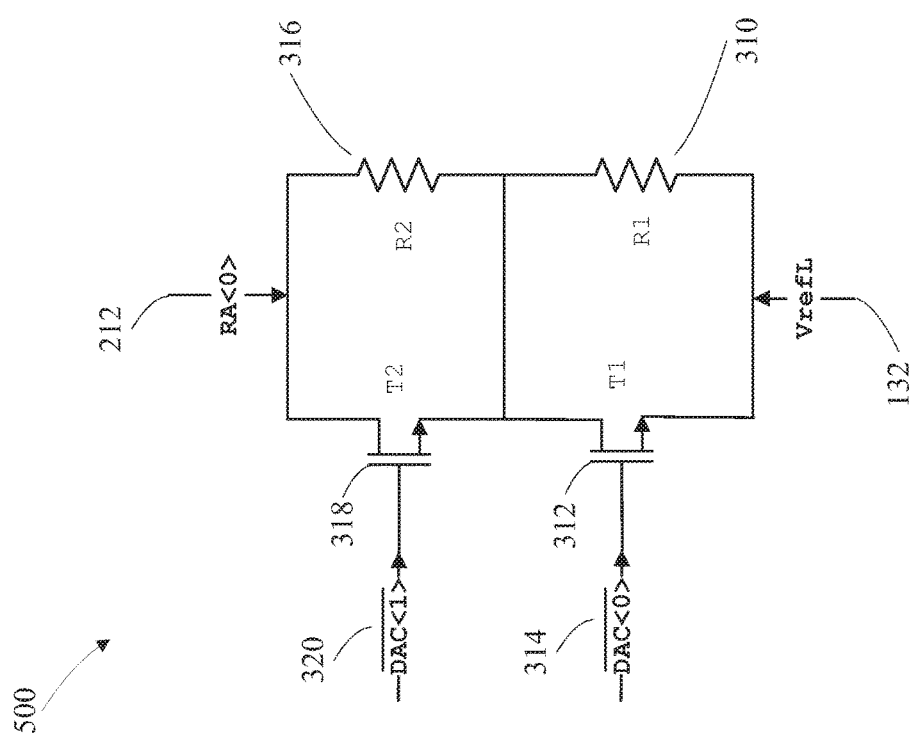
FIG. 5 is an example set of lower extended bit transistors in accordance with one embodiment of the disclosure.

FIG. 5 depicts an example lower set of extended bits comprising a first lower bit extension resistor 316 (R2) coupled to a lower end of said non-linear voltage divider output (RA<0>) 212, a first lower bit extension switch 318 (T2) coupled in parallel with the first lower bit extension resistor 316 (R2), wherein the first lower bit extension switch is modulated by a first complementary DAC extension bit input 320 (DAC<1>bar). The first lower bit extension resistor 316 (R2) may be include some form of FET resistance to match the first lower bit extension switch 318 (T2).

A second lower bit extension resistor 310 (R1) is coupled to the first lower bit extension resistor 316 (R2) opposite the end coupled to the lower end of said non-linear voltage divider and a second lower bit extension switch 312 (T1) coupled in parallel with the second lower bit extension resistor 310 (R1), wherein the second lower bit extension switch is modulated by a second complementary DAC extension bit input 314 (DAC<0>bar). The second lower bit extension resistor 310 (R1) may be include some form of FET resistance to match the second lower bit extension switch 312 (T1).

Figure 6:
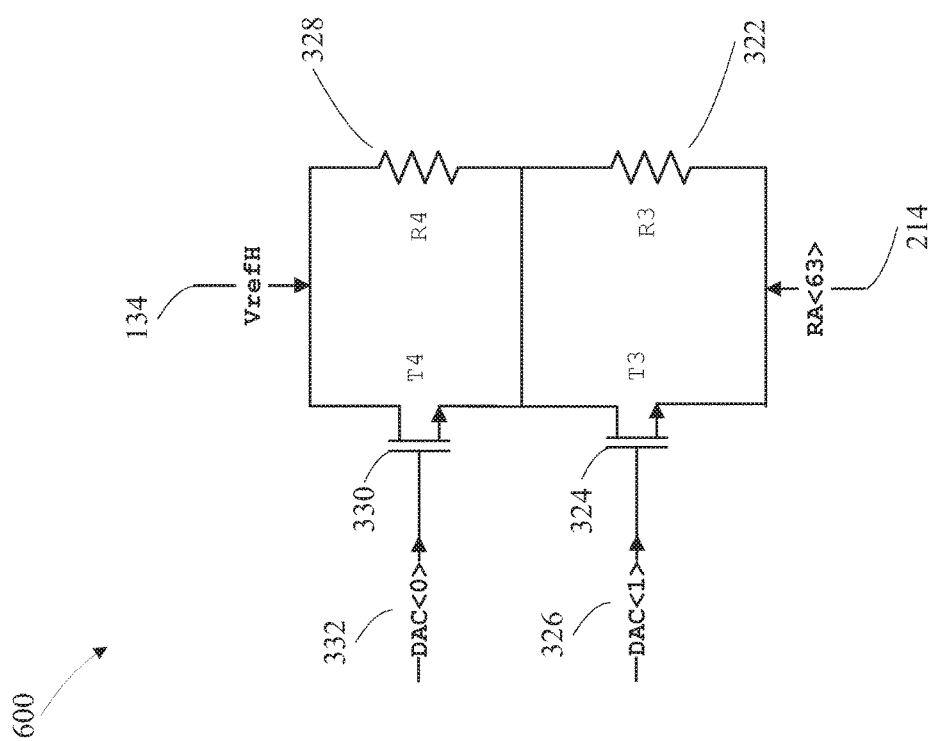
FIG. 6 is an example set of upper extended bit transistors in accordance with one embodiment of the disclosure.

FIG. 6 depicts an example upper set of extended bits comprising a first upper bit extension resistor 322 (R3) coupled to an upper end of said non-linear voltage divider (RA<63>), a first upper bit extension switch 324 (T3) coupled in parallel with the first upper bit extension resistor 322 (R3), wherein the first upper bit extension switch 324 (T3) is modulated by a first DAC extension bit input 326 (DAC<1>). The first upper bit extension resistor 322 (R3) may be include some form of FET resistance to match the first upper bit extension switch 324 (T3).

A second upper bit extension resistor 328 (R4) is coupled to the first upper bit extension resistor 322 (R3) opposite the end coupled to the upper end of said non-linear voltage divider and a second upper bit extension switch 330 (T4) coupled in parallel with the second upper bit extension resistor 328 (R4), wherein the second upper bit extension switch 330 (T4) is modulated by a second DAC extension bit input 332 (DAC<0>). The second upper bit extension resistor 328 (R4) may be include some form of FET resistance to match the second upper bit extension switch 330 (T4).

Figure 7:
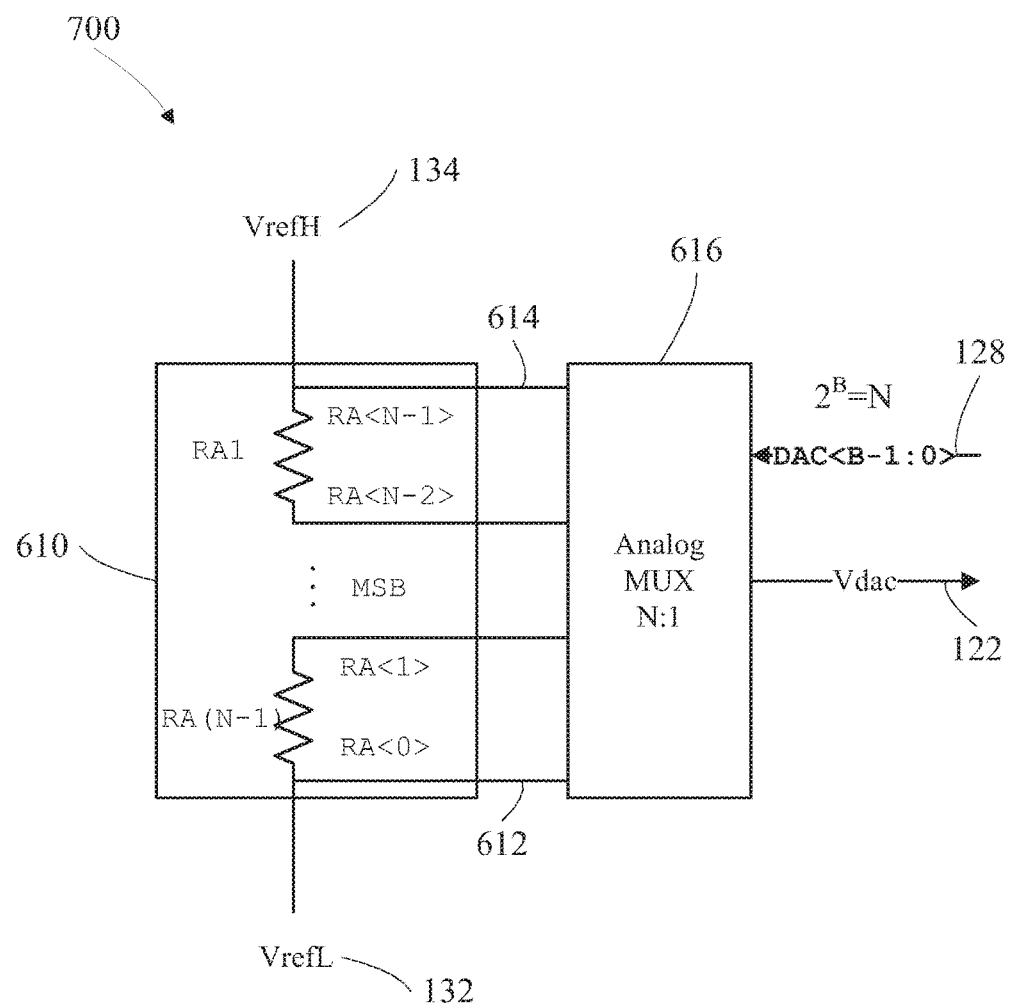
FIG. 7 is an example of a DAC using a linear or non-linear voltage divider of size N and an analog multiplexer in accordance with one embodiment of the disclosure.

FIG. 7 depicts an example non-linear voltage divider comprising an analog multiplexer 616 having analog multiplexer inputs coupled to the non-linear voltage divider 610 and configured to output an analog multiplexer output 122 (Vdac). The non-linear voltage divider 610 comprises N−1 resistors having different resistances to match a non-linear voltage characteristic of the diode voltage indicative of temperature. The upper resistor in the network being R1, having an output 614 (RA<N−1>). The lower resistor in the network being R(N−1), having an output 612 (RA<0>).

Figure 8:
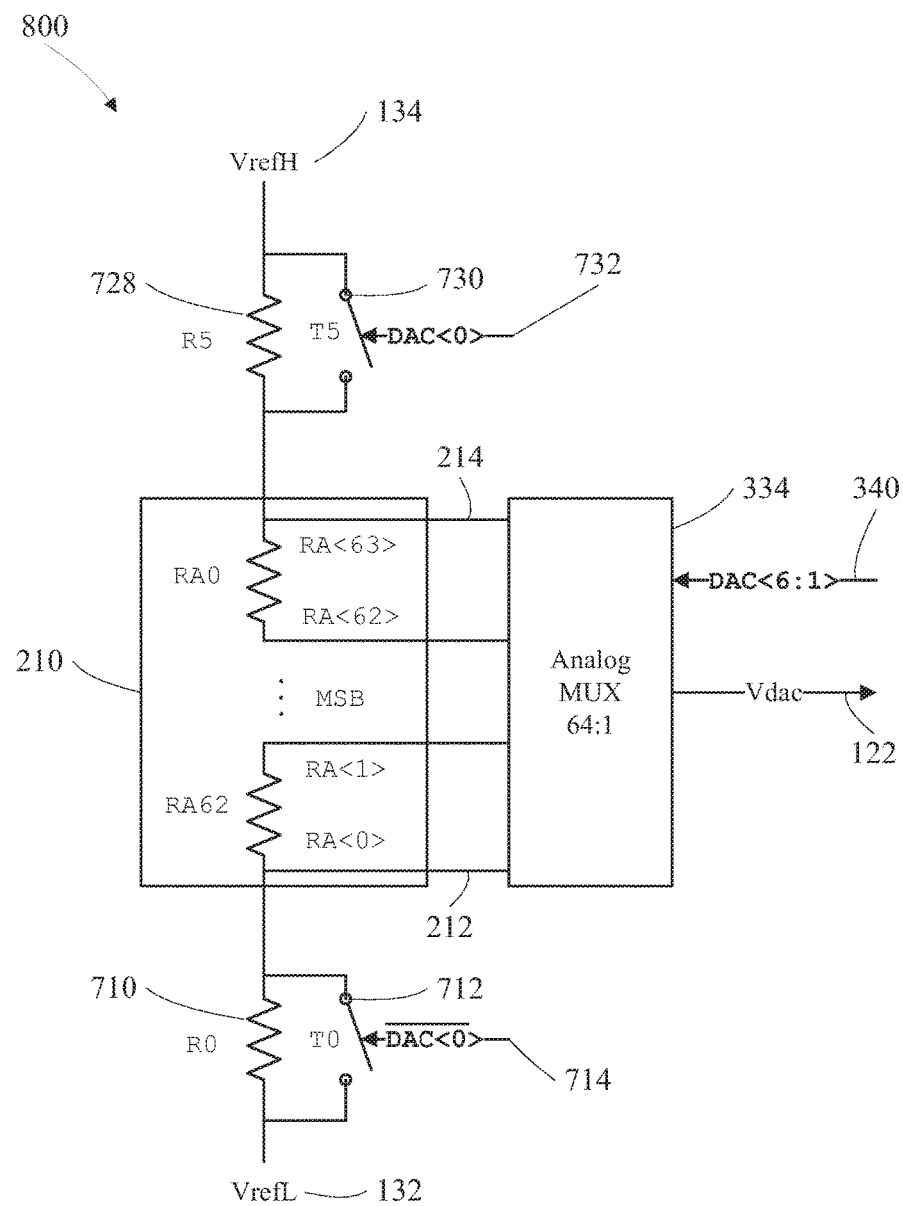
FIG. 8 is an example of a DAC using a linear or non-linear voltage divider with one extended bit and an analog multiplexer in accordance with one embodiment of the disclosure.

FIG. 8 depicts an example non-linear voltage divider with one extended bit comprising a first lower bit extension resistor 710 (R0) coupled to a lower end of said non-linear voltage divider output (RA<0>) 212, a first lower bit extension switch 712 (T0) coupled in parallel with the first lower bit extension resistor 710 (R0), wherein the first lower bit extension switch is modulated by a first complementary DAC extension bit input 714 (DAC<0>bar).

A first upper bit extension resistor 728 (R5) is coupled to upper end of said non-linear voltage divider output (RA<63>) 214, to the upper reference VrefH 134, and a first upper bit extension switch 730 (T5) coupled in parallel with the first upper bit extension resistor 728 (R5), wherein the first upper bit extension switch 730 (T5) is modulated by a first DAC extension bit input 732 (DAC<0>). In this example, R0=R5=R.

An analog multiplexer 334 having analog multiplexer inputs coupled to the non-linear voltage divider 210 and configured to output an analog multiplexer output 122 (Vdac).

Figure 9:
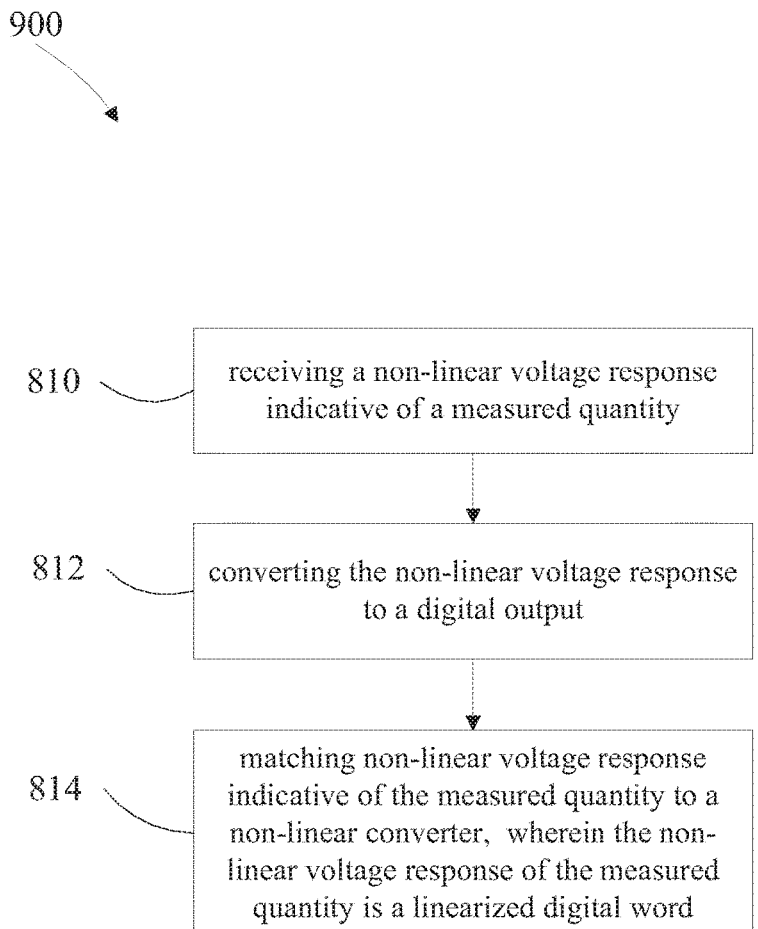
FIG. 9 is an example flowchart of a method of linearizing outputs in accordance with one embodiment of the disclosure.

FIG. 9 depicts an example method of linearizing temperature outputs comprises receiving 810 a non-linear diode voltage representation of temperature, converting 812 the diode voltage to a digital output and matching 814 the non-linear voltage response indicative of the measured quantity to a non-linear digital analog converter, wherein the non-linear voltage response of the measured quantity is a linearized digital word.

Figure 10:
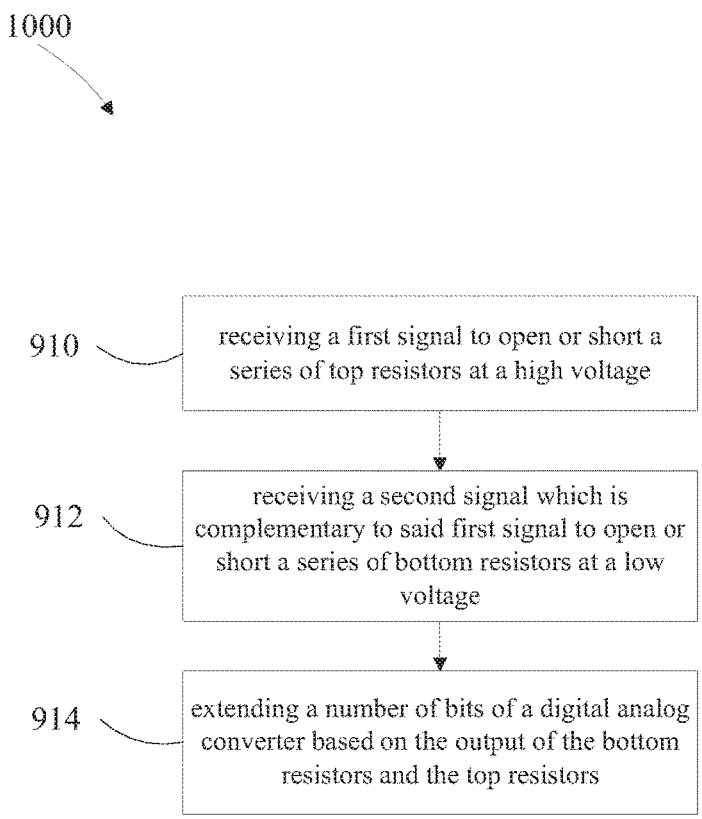
FIG. 10 is an example flowchart of a method of extending the number of bits of a digital to analog converter (DAC) in accordance with one embodiment of the disclosure.

FIG. 10 depicts an example method of extending the number of bits of a DAC comprises receiving 910 a first signal to perform one of opening and shorting a series of top resistors at a high voltage, receiving 912 a second signal complementary to the first signal to perform one of opening and shorting a series of bottom resistors at a low voltage and extending 914 a number of bits of a digital analog converter based on an output of the bottom resistors and the top resistors. In this example the top and bottom opens and shorts are performed in pairs based on the first signal and the second signal, which is complementary to the first signal. In this example the 6 bit converter is centered utilizing two extended bits creating a converter which is essentially 8 bits. The calibration centers the effective 8 bit DAC with the VrefH and VrefL.

Figure 11:
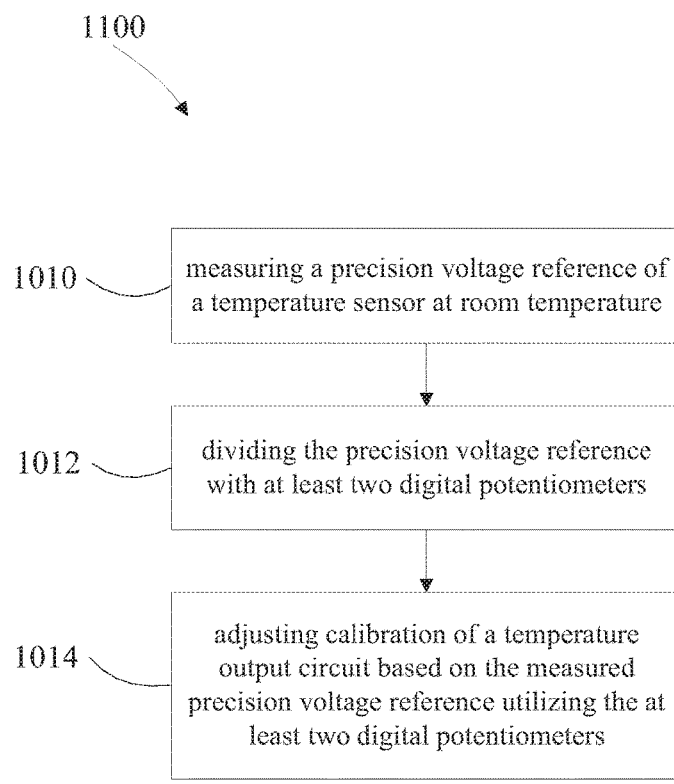
FIG. 11 is an example flowchart of a method of calibrating temperature outputs in accordance with one embodiment of the disclosure.

FIG. 11 depicts a method of calibrating temperature outputs comprising measuring 1010 a precision voltage reference of a temperature sensor at room temperature. The precision reference in this example is a bandgap voltage, Vbg. To one skilled in the art there is a multitude of ways to create sub-voltages from a precision voltage, one way is to utilize a set of resistor dividers. The calibration components that are part of this network and are used to adjust VrefH and VrefL may be digital potentiometers. A lower impedance resistor divider network may be set between Vbg and ground. Two points may be tapped between using a higher impedance resistor divider network. The higher impedance resistor divider network may consist of two digital potentiometers one at the top and bottom with a non-linear voltage divider between the two digital potentiometers. The calibration may be set by adjusting the digital potentiometers to set VrefH and VrefL. VrefH and VrefL thus affect the gain and offset of the temperature sensor. If the error in the precision reference is known, then the related gain and offset correction is also known. The second step of FIG. 11 comprises dividing 1012 the precision voltage reference with at least two digital potentiometers, followed by adjusting calibration 1014 of a temperature output circuit based on the measured precision voltage reference utilizing the at least two digital potentiometers.

The temperature sensor response is calibrated using the offset at room temp or other nominal temperature of the precision reference combined with a known transfer function of the nonlinear DAC. The gain and offset calibration is based on Vbg and a set of resistors used to set up VrefH and VrefL.

Fabrication Technologies and Options

The term "MOSFET" technically refers to metal-oxide-semiconductors; another synonym for MOSFET is "MISFET", for metal-insulator-semiconductor FET. However, "MOSFET" has become a common label for most types of insulated-gate FETs ("IGFETs"). Despite that, it is well known that the term "metal" in the names MOSFET and MISFET is now often a misnomer because the previously metal gate material is now often a layer of polysilicon (polycrystalline silicon). Similarly, the "oxide" in the name MOSFET can be a misnomer, as different dielectric materials are used with the aim of obtaining strong channels with smaller applied voltages. Accordingly, the term "MOSFET" as used herein is not to be read as literally limited to metal-oxide-semiconductors, but instead includes IGFETs in general.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET and IGFET structures), or in hybrid or discrete circuit forms. Integrated circuit embodiments may be fabricated using any suitable substrates and processes, including but not limited to standard bulk silicon, silicon-on-insulator (SOI), silicon-on-sapphire (SOS), GaAs pHEMT, GaAs HBT and MESFET technologies. However, the inventive concepts described above are particularly useful with an SOI-based fabrication process (including SOS), and with fabrication processes having similar characteristics. Fabrication in CMOS on SOI or SOS enables low power consumption, the ability to withstand high power signals during operation due to FET stacking, good linearity, and high frequency operation. Monolithic IC implementation is particularly useful since parasitic capacitances generally can be kept low by careful design.

One aspect of the disclosure is the monolithic integration of the non-linear converter. In this aspect, the multiple resistors may create a non-linear transfer function. A precision reference such as a bandgap device is utilized to set voltages at the upper and lower ends of the multiple resistors. A sensor such as a diode, silicon bandgap temperature sensor, a resistance thermometer, a thermocouple, a thermistor, a thermopile, a piezo-resistive sensor, a capacitive sensor, an inductive sensor, a hall effect sensor, an eddy current sensor, a piezoelectric sensor, an optical sensor, a potentiometric sensor, a photoconductive sensor, a photovoltaic sensor, a photodiode sensor, a phototransistor sensor, a CMOS image sensor, a current sensor and a voltage sensor and the like may be integrated with the non-linear converter. Additional functions such as logic, switching and amplification may be integrated with the non-linear converter.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functional without significantly altering the functionality of the disclosed circuits.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion. It is to be understood that the foregoing description is intended to illustrate and not to limit the scope of the invention, which is defined by the scope of the following claims, and that other embodiments are within the scope of the claims.

What is claimed is:

1. A non-linear converter comprising:
an electronic block configured to output an analog output based on a logic signal and a nonlinear transfer function;
an analog comparator having an analog comparator first input configured to receive an analog input voltage, an analog comparator second input configured to receive said analog output, the analog comparator configured to output a comparator voltage output; and
a logic loop coupled to said analog comparator and configured to receive said comparator voltage output and configured to output said logic signal, wherein said logic signal represents a linearized digital word.

2. The non-linear converter of claim 1, wherein the electronic block further comprises a non-linear voltage divider having a plurality of resistors defining the non-linear transfer function.

3. The non-linear converter of claim 2, wherein the electronic block further comprises an analog multiplexer having analog multiplexer inputs coupled to said non-linear voltage divider and configured to output the analog output.

4. The non-linear converter of claim 3, further comprising:
at least one lower bit extension resistor coupled to a lower end of said non-linear voltage divider;
at least one lower bit extension transistor coupled in parallel with the at least one lower bit extension resistor, wherein at least one lower bit extension transistor gate is configured to receive at least one extension bit input;
at least one upper bit extension resistor coupled to an upper end of said non-linear voltage divider; and
at least one upper bit extension transistor coupled in parallel with the at least one upper bit extension resistor, wherein at least one upper bit extension transistor gate is configured to receive at least one complementary extension bit input.

5. The non-linear converter of claim 3, wherein the non-linear voltage divider is configured to receive a voltage reference high input and the non-linear voltage divider is configured to receive a voltage reference low input.

6. The non-linear converter of claim 3, wherein the non-linear voltage divider comprises p-doped poly resistors.

7. The non-linear converter of claim 3, wherein the analog input voltage represents a measured temperature.

8. The non-linear converter of claim 3, wherein the analog input voltage is from at least one of a diode, silicon bandgap temperature sensor, a resistance thermometer, a thermocouple, a thermistor and a thermopile.

9. The non-linear converter of claim 3, wherein the analog input voltage represents a measured pressure.

10. The non-linear converter of claim 3, wherein the analog input voltage is from at least one of a piezo-resistive sensor, a capacitive sensor, an inductive sensor, a hall effect sensor, an eddy current sensor, a piezoelectric sensor, an optical sensor and a potentiometric sensor.

11. The non-linear converter of claim 3, wherein the analog input voltage represents a measured irradiance.

12. The non-linear converter of claim 1, wherein the analog input voltage is from at least one of a photoconductive sensor, a photovoltaic sensor, a photodiode sensor, a phototransistor sensor and a CMOS image sensor.

13. The non-linear converter of claim 1, wherein the analog input voltage represents a measured electrical power.

14. The non-linear converter of claim 1, wherein the analog input voltage is from at least one of a current sensor, a voltage sensor and a power sensor.

15. The non-linear converter of claim 1 further comprising:
at least one lower bit extension resistor coupled to a lower end of said non-linear voltage divider;
at least one lower bit extension switch coupled in parallel with the at least one lower bit extension resistor, wherein the at least one lower bit extension switch is modulated by a first extension bit input;
at least one upper bit extension resistor coupled to an upper end of said non-linear voltage divider; and
at least one upper bit extension switch coupled in parallel with the at least one upper bit extension resistor, wherein the at least one upper bit extension switch is modulated by a first complementary extension bit input.

16. The non-linear converter of claim 15, wherein the at least one lower bit extension resistor and the at least one upper bit extension resistor have similar resistivities.

17. The non-linear converter of claim 13, wherein first extension bit input and the first complementary extension bit input have opposing signal levels.

18. A method of linearizing non-linear voltage response outputs comprising;
receiving a non-linear voltage response indicative of a measured quantity;
converting the non-linear voltage response to a digital output; and
matching non-linear voltage response indicative of the measured quantity to a non-linear converter, wherein the non-linear voltage response of the measured quantity is a linearized digital word.

19. The method of linearizing non-linear voltage response outputs of claim 18, wherein the matching non-linear voltage response is provided by a non-linear voltage divider having a plurality of resistors representing a non-linear transfer function in the non-linear converter.

20. The method of linearizing non-linear voltage response outputs of claim 18, wherein a number of bits is extended by
receiving a first signal to perform one of opening and shorting a series of bottom resistors at a low voltage;
receiving a second signal to perform one of opening and shorting a series of top resistors at a high voltage; and
extending the number of bits of a digital analog converter based on an output of the bottom resistors and the top resistors.

* * * * *